Dec. 12, 1967 ER-CHUN HO ET AL 3,358,244

HIGHLY LINEAR VOLTAGE CONTROLLED CRYSTAL OSCILLATOR

Filed May 3, 1965 2 Sheets-Sheet 1

INVENTORS.
ER-CHUN HO,
JOHN J. FACKELDEY,
BY
Paul M. Coble
ATTORNEY.

INVENTORS.
ER-CHUN HO,
JOHN J. FACKELDEY,
BY Paul M. Coble
ATTORNEY.

United States Patent Office 3,358,244
Patented Dec. 12, 1967

3,358,244

HIGHLY LINEAR VOLTAGE CONTROLLED CRYSTAL OSCILLATOR

Er-Chun Ho, Newport Beach, and John J. Fackeldey, Huntington Beach, Calif., assignors to Hughes Aircraft Company, Culver City, Calif., a corporation of Delaware Filed May 3, 1965, Ser. No. 452,777
3 Claims. (Cl. 331—116)

ABSTRACT OF THE DISCLOSURE

In the disclosed oscillator circuit a transistor is connected in a feedback path including a variable capacitance configuration and a frequency stabilizing network. The variable capacitance configuration includes two varactor diodes connected in series in opposite polarity and a capacitance connected in parallel with the series diodes. The frequency stabilizing network includes a plurality of quartz crystals and an inductance connected in parallel. A control voltage applied to the variable capacitance configuration allows the oscillation frequency to be varied.

This invention relates to crystal oscillators, and more particularly relates to a voltage controlled crystal oscillator having a unique feedback circuit which insures the achievement of excellent linearity and stability.

In certain applications of voltage controlled oscillators, such as radar tracking systems, it is necessary that the oscillators be extremely linear and stable over a relatively wide frequency range. The desired degree of stability can usually be achieved by employing a quartz crystal as a frequency stabilizing element. However, with such oscillators it is difficult to obtain the necessary degree of linearity over more than a narrow frequency range.

One scheme which has been employed to extend the linearity range of a voltage controlled crystal oscillator involves mixing the crystal oscillator output frequency with a slightly different frequency from a reference oscillator to produce a difference frequency much lower than the center frequency of the crystal oscillator. The difference frequency signal is fed through a frequency multiplier to produce a net output signal at a frequency of the same order of magnitude or higher than the crystal oscillator center frequency. For a change in crystal oscillator frequency of a given number of cycles per second, the difference frequency will change by the same number of cycles per second, but by a much greater percentage than the percentage change in the crystal oscillator frequency. The net output frequency will change by the same percentage as the difference frequency; but on account of the frequency multiplication, the variation of the output signal in cycles per second is substantially greater than the cycle per second change in the difference frequency signal, and hence is also much greater than the original change in crystal oscillator frequency. Although this technique is able to extend the control range of a voltage controlled crystal oscillator, there is a tendency for spurious signals to be produced, and the stability of such an arrangement is unsatisfactory for some applications.

Accordingly, it is an object of the present invention to provide a voltage controlled crystal oscillator having exceptional linearity and stability over a relatively wide frequency range.

It is a further object of the present invention to provide a highly linear voltage controlled crystal oscillator in which any tendency to generate spurious signals in the frequency control range is substantially eliminated.

It is still another object of the present invention to provide a voltage controlled crystal oscillator which, in addition to possessing the foregoing advantages, is simple and compact in design and highly reliable in operation.

In accordance with the objects set forth above, the voltage controlled crystal oscillator circuit in accordance with the present invention includes a semiconductor amplifying device having a current path and a control electrode, and a feedback circuit for deriving a signal from current in the current path and applying it to the control electrode. The feedback circuit includes an electrically variable capacitance arrangement and a frequency stabilizing network coupled in series. The electrically variable capacitance arrangement includes first and second varactor diodes connected in series in opposite polarity and a capacitance connected in parallel with the series diodes. The frequency stabilizing network includes a plurality of quartz crystals and an inductance connected in parallel. The semiconductor amplifying device is biased to an operating condition enabling oscillations to be sustained at a frequency determined by the frequency stabilizing network and the electrically variable capacitance arrangement. By applying a control voltage to the electrically variable capacitance arrangement the oscillation frequency may be varied. The variable capacitance arrangement and the frequency stabilizing network insure that the oscillation frequency is a highly linear function of the magnitude of the control voltage over a relatively wide frequency range.

Other and further objects, advantages, and characteristic features of the present invention will become readily apparent from the following detailed description of the invention when considered in conjunction with the accompanying drawings in which.

Figure 1:
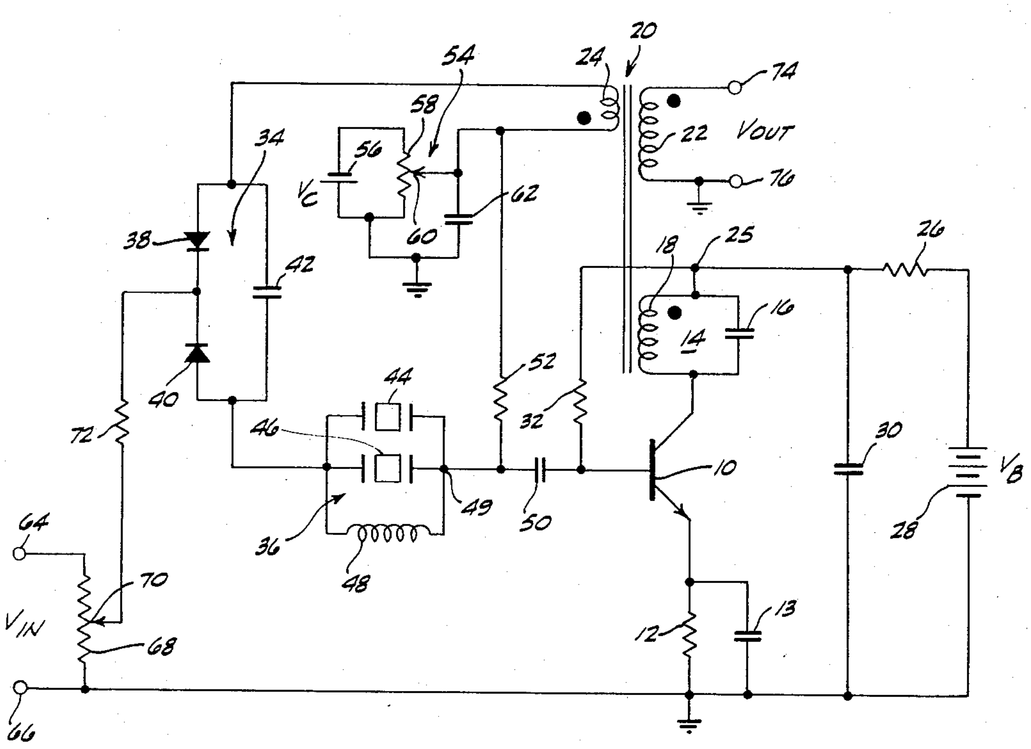
FIG. 1 is a schematic circuit diagram illustrating a preferred embodiment of the invention.

Referring to FIG. 1 with greater particularity, the illustrative embodiment of the present invention shown therein may be seen to take the form of a Hartley-type oscillator, although it is to be understood that the principles of the present invention are also applicable to crystal feedback oscillators having other specific configurations. The circuit of FIG. 1 comprises a semiconductor amplifying device 10, illustrated as an npn transistor, although a pnp transistor could equally well be employed. An example of a specific transistor which may be used is a 2N708 transistor manufactured by Radio Corporation of America, Harrison, N.J.

The emitter electrode of the transistor 10 is coupled by means of a parallel bias resistor 12 and rf bypass capacitor 13 to a level of reference potential illustrated as ground in FIG. 1. The collector electrode of the transistor 10 is connected to a parallel resonant, or tank, circuit 14 which is tuned to a frequency in the vicinity of a selected center frequency $f_0$ for the oscillator circuit. The tank circuit 14 comprises a capacitor 16 connected in parallel with primary winding 18 of a transformer 20 having a first secondary winding 22 and a second secondary winding 24. The polarity of the signals induced in the windings 22 and 24 is indicated in the conventional manner by the dots adjacent the windings 18, 22 and 24.

The tank circuit terminal 25 which is electrically remote from the collector electrode of the transistor 10 is connected via a resistor 26 to the positive terminal of a power supply illustrated as a battery 28. The power supply 28 provides a voltage $V_B$ which may be 14 volts, for example. A bypass capacitor 30 is connected between the tank circuit terminal 25 and the negative terminal of the power supply 28 which is returned to the ground level. Obviously, the polarity of the power supply 28 would be reversed in the event a pnp transistor is used as the amplifying device 10. The terminal 25 of the tank circuit 14 is also connected to the base electrode of the transistor 10 through a bias resistor 32.

The signal induced in the secondary winding 24 of the transformer 20 is applied to the base electrode of the transistor 10 through a feedback path including an electrically variable capacitance arrangement 34 and a frequency stabilizing network 36 coupled in series. In accordance with the principles of the present invention, the electrically variable capacitance arrangement 34 and the frequency stabilizing network 36 are of a unique and critical configuration which enables the excellent linearity and stability to be achieved.

Specifically, the electrically variable capacitance arrangement 34 includes a pair of varactor diodes 38 and 40 connected in series in opposite polarity with their cathodes connected together, and a compensating capacitor 42 connected between the anodes of the diodes 38 and 40. The diodes 38 and 40, which may be V27E "Varacap" silicon junction diodes manufactured by TRW Semiconductors Inc., Lawndale, Calif., provide a capacitance vs. voltage characteristic in which the capacitance decreases nonlinearly as a function of increasing voltage. The compensating capacitor 42 modifies the capacitance vs. voltage characteristic of the diodes 38 and 40 by reducing the magnitude of the rate of change of capacitance as a function of increasing voltage, as will be discussed more fully below. In the circuit illustrated in FIG. 1 one terminal of the electrically variable capacitance arrangement 34 is connected to the non-dotted end of the transformer secondary winding 24, while the opposite terminal is connected to the frequency stabilizing network 36.

The frequency stabilizing network 36 includes a plurality of piezoelectric crystals 44 and 46 and an inductor 48 connected in parallel. The crystals 44 and 46 may be AT cut quartz crystals having the same series resonant frequency, which may be 28.95 mc. for example, and which series resonant frequency is below the lowest frequency required in the control range of the circuit. The crystals 44 and 46 should also have an electrode spot size sufficiently small to preclude the generation of spurious resonant modes in the crystal. Freedom from spurious resonances is usually insured by making the electrode spot diameter less than ⅓ of the crystal diameter.

The inductance provided by the inductor 48 should be selected to afford parallel resonance (maximum impedance) with the shunt capacitance of the crystals 44 and 46 at a frequency in the vicinity of the series resonant frequency of the crystals. The terminal 49 of the frequency stabilizing network 36 which is electrically remote from the variable capacitance arrangement 34 is coupled to the base electrode of the transistor 10 through a DC blocking capacitor 50 and is also coupled via a resistor 52 to the dotted end of the transformer secondary winding 24.

In order to bias the electrically variable capacitance arrangement 34 appropriately for a selected oscillator center frequency, a center frequency adjusting arrangement 54 is provided. The arrangement 54 includes a bias supply, illustrated as a battery 56, providing a voltage $V_C$ which may be 50 volts, for example. A potentiometer 58 having a movable tap 60 is connected across the terminals of the bias supply 56. The movable potentiometer tap 60 is connected directly to the dotted end of the transformer secondary winding 24 and is also returned to ground via an rf bypass capacitor 62.

The voltage appearing at the potentiometer tap 60 is applied to the anode of the diode 38 through the secondary winding 24 and to the anode of the diode 40 via resistor 52 and inductor 48. This voltage should be of a magnitude and polarity to insure that the diodes 38 and 40 are reverse biased throughout the control range of the circuit.

Input terminals 64 and 66 for the circuit are adapted to receive an input voltage $V_{IN}$, which controls the capacitance of the arrangement 34 to establish the desired operating frequency for the circuit. The voltage $V_{IN}$ may be either a DC control voltage or a relatively low frequency AC modulating voltage. A sensitivity adjusting potentiometer 68 having a movable tap 70 is connected between the terminals 64 and 66, with the terminal 66 being grounded. The movable potentiometer tap 70 is connected via a resistor 72 to the junction between the cathodes of the diodes 38 and 40. The output voltage $V_{OUT}$ from the circuit, which is at a frequency determined by the magnitude of the input voltage $V_{IN}$, is provided between output terminals 74 and 76 which are connected to the respective ends of the transformer secondary winding 22.

In the operation of the circuit of FIG. 1 the transistor 10 is biased to a conductive condition by means of the power supply 28 and resistors 12, 26 and 32. A portion of the resultant signal in the tank circuit 14 is regeneratively fed back to the base electrode of the transistor 10 via the secondary winding 24, the electrically variable capacitance arrangement 34, and the frequency stabilizing network 36 so that oscillations may be sustained. The oscillation frequency $f$ is determined approximately by the series resonant frequency of the feedback loop and may be expressed as $$f \approx \frac{1}{2\pi\sqrt{\frac{L_1C_1C_2}{C_1+C_2}}} \quad (1)$$

where $L_1$ and $C_1$ are the net series inductance and capacitance, respectively, of the frequency stabilizing network 36, and $C_2$ is the capacitance of the electrically variable capacitance arrangement 34.

When no signal is applied to the input terminals 64 and 66, the center frequency adjusting arrangement 54 biases the diodes 38 and 40 so that the capacitance $C_2$ of the variable capacitance arrangement 34 is of the proper value for series resonance, hence oscillations, at the selected center frequency $f_0$. When a positive input voltage $V_{IN}$ is applied between the terminals 64 and 66, the bias applied to the diodes 38 and 40 is altered so that the capacitance $C_2$ of the arrangement 34 decreases, thereby increasing the frequency $f$ at which the circuit oscillates. In response to a negative voltage applied between the input terminals 64 and 66, the capacitance $C_2$ of the arrangement 34 increases, resulting in a decrease in the oscillation frequency $f$.

As has been indicated above, it is desired that the change in oscillation frequency $\Delta f$ be linearly related to the input voltage $V_{IN}$, i.e.

$$\Delta f = KV_{IN} \quad (2)$$

where K is the desired proportionality constant. Thus, it becomes apparent that the capacitance $C_2$ in Equation 1 must vary as some function of the input voltage $V_{IN}$ so as to satisfy Equation 2.

Figure 2:
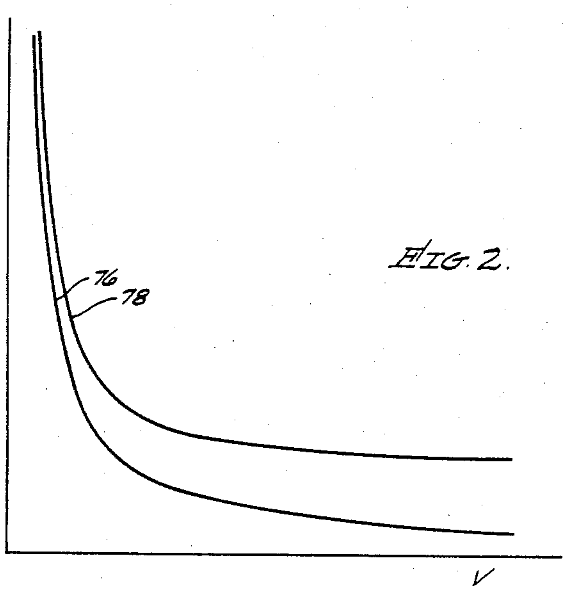
FIG. 2 is a graph illustrating the capacitance vs. voltage characteristics of the electrically variable capacitance arrangement in the circuit of FIG. 1, both with and without the compensating capacitor.

The series diodes 38 and 40 provide a capacitance C which is essentially inversely proportional to the square of the applied voltage V, and such a capacitance vs. voltage characteristic is illustrated by the curve 76 of FIG. 2. For relatively low values of voltage V, a capacitance variation according to the curve 76 usually is capable of satisfying Equation 2. However, for larger values of voltage a capacitance vs. voltage characteristic according to the curve 76 is inadequate, thereby imposing a limitation on the control range over which a linear frequency variation can be afforded.

By connecting the capacitor 42 in parallel with the series diodes 38 and 40, a net capacitance vs. voltage characteristic shown by the curve 78 is provided. It may be observed that for increasing voltage V the magnitude of the rate of change of capacitance along the curve 78 is reduced from that along the curve 76 for the same voltage values. A capacitance vs. voltage variation in accordance with the curve 78 is capable of satisfying Equation 2 over a much wider range of voltage than the curve 76, thereby enabling the circuit of the present invention to provide an extremely linear variation in frequency as a function of the magnitude of the input voltage $V_{IN}$ over an increased frequency range.

By adjusting the setting of the potentiometer tap 70, the effect which input voltage $V_{IN}$ has on altering the oscillation frequency of the circuit may be varied, thereby affording an independent sensitivity control for the circuit. Moreover, since the capacitance of the arrangement 34 may be preset to a desired steady state value by adjustment of the potentiometer tap 60, an independent center frequency control is provided.

By utilizing crystals with small electrode spot areas, minimization of spurious signals is insured. Any decrease in crystal series capacitance as a result of the small electrode spots is compensated for by the use of a plurality of crystals in parallel, enabling the series capacitance $C_1$ of the frequency stabilizing network 34 to be made sufficiently large so that the achievement of a wide frequency control range is not impaired.

Figure 3:
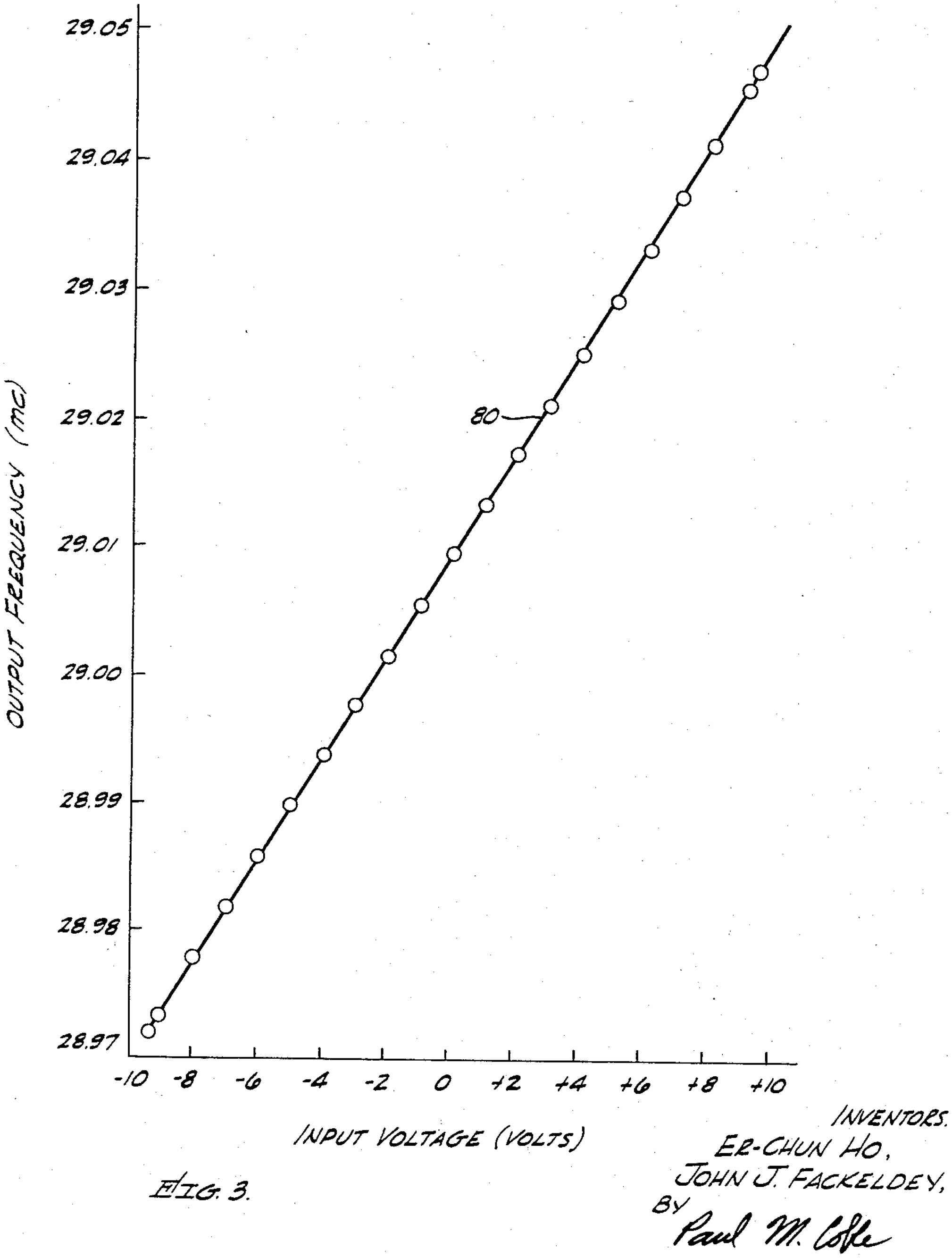
FIG. 3 is a graph illustrating the output frequency as a function of input voltage for a circuit constructed according to FIG. 1.

The results achievable with the present invention in providing an extremely linear variation in output frequency as a function of input control voltage are illustrated by the plot 80 in FIG. 3. Data for FIG. 3 was obtained from a circuit constructed in accordance with FIG. 1 and with components selected to provide a center frequency $f_0$ of 29.009 mc. The circuit was maintained at a temperature of 25° C., and the input voltage $V_{IN}$ was varied between +10 and −10 volts. It may be observed that the plot 80 of FIG. 3 is exceptionally linear over a range of 70 kc., or .24% of the center frequency. Other circuits have been constructed according to the present invention which exhibited a highly linear change in frequency as a function of control voltage over as wide a range as .70% of the center frequency. The frequency vs. voltage characteristics for these circuits remained essentially stable over a wide range of temperatures and over a long period of time.

Although the present invention has been shown and described with reference to a particular embodiment, nevertheless various changes and modifications obvious to a person skilled in the art to which the invention pertains are deemed to be within the spirit, scope and contemplation of the invention.

What is claimed is:

1. An oscillator circuit comprising: a transistor having an emitter electrode, a collector electrode, and a base electrode; a transformer having a primary winding and a secondary winding; said primary winding having one terminal connected to said collector electrode; a capacitor connected across said primary winding; a feedback path coupled between one terminal of said secondary winding and said base electrode; said feedback path including an electrically variable capacitance arrangement and a frequency stabilizing network coupled in series; said electrically variable capacitance arrangement including first and second varactor diodes connected in series in opposite polarity and a capacitance connected in parallel with the series diodes; said frequency stabilizing network including a plurality of quartz crystals and an inductance connected in parallel; means coupled to said base and emitter electrodes and to the respective other terminals of said primary and said secondary windings for biasing said transistor to an operating condition enabling varying current to flow therethrough at a selected frequency determined by said frequency stabilizing network and said electrically variable capacitance arrangement; and means for applying a control voltage to said electrically variable capacitance arrangement to vary said selected frequency.

2. A circuit for providing an output voltage at a frequency determined by the magnitude of an input voltage, with the frequency of the output voltage being a highly linear function of the input voltage magnitude, comprising: a transistor having an emitter electrode, a collector electrode, and a base electrode; a transformer having a primary winding and first and second secondary windings; said primary winding having one terminal connected to said collector electrode; a capacitor connected across said primary windings; a feedback path coupled between one terminal of said first secondary winding and said base electrode; said feedback path including an electrically variable capacitance arrangement and a frequency stabilizing network coupled in series; said electrically variable capacitance arrangement including first and second semiconductor diodes connected in series in opposite polarity, said semiconductor diodes having a capacitance vs. voltage characteristic in which the capacitance varies nonlinearly as a function of increasing voltage, and capacitance means connected in parallel with the series diodes for modifying said characteristic by reducing the magnitude of the rate of change of capacitance as a function of increasing voltage; said frequency stabilizing network including at least first and second quartz crystals connected in parallel, each of said crystals having the same series resonant frequency and having an electrode spot size sufficiently small to substantially preclude the generation of spurious resonant modes in the crystals, and an inductor connected in parallel with said crystals, said inductor having an inductance value providing parallel resonance with the shunt capacitance of said crystals at a frequency in the vicinity of the series resonant frequency of said crystals; means coupled to said base and emitter electrodes and to the respective other terminals of said primary and said first secondary windings for biasing said transistor to an operating condition enabling varying current to flow therethrough at a selected frequency determined by said frequency stabilizing network and said electrically variable capacitance arrangement; means for applying said input voltage to said electrically variable capacitance arrangement to vary said selected frequency; and means coupled to said second secondary winding for obtaining said output voltage.

3. A circuit for providing an output voltage at a frequency determined by the magnitude of an input voltage, with the frequency of the output voltage being a highly linear function of the input voltage magnitude, comprising: a transistor having an emitter electrode, a collector electrode, and a base electrode; a transformer having a primary winding and first and second secondary windings; said primary winding having one terminal connected to said collector electrode; a capacitor connected across said primary winding; a feedback path coupled between one terminal of said first secondary winding and said base electrode; said feedback path including an electrically variable capacitance arrangement and a frequency stabilizing network coupled in series; said electrically variable capacitance arrangement including first and second terminals between which an electrically variable capacitance is provided, first and second semiconductor diodes connected in series in opposite polarity between said first and second terminals, said semiconductor diodes having a capacitance vs. voltage characteristic in which the capacitance varies nonlinearly as a function of increasing voltage, capacitance means connected in parallel with the series diodes for modifying said characteristic by reducing the magnitude of of the rate of change of capacitance as a function of increasing voltage, and a control terminal connected to the junction between said first and second semiconductor diodes; said frequency stabilizing network including at least first and second quartz crystals connected in parallel, each of said crystals having the same series resonant frequency and having an electrode spot size sufficiently small to substantially preclude the generation of spurious resonant modes in the crystal, and an inductor connected in parallel with said crystals, said inductor having an inductance value providing parallel resonance with the shunt capacitance of said crystals at a frequency in the vicinity of the series resonant frequency of said crystals; means coupled to said base and emitter electrodes and to the respective other terminals of said primary and said first secondary windings for biasing said transistor to an operating condition enabling varying current to flow therethrough at a frequency determined by said frequency stabilizing network and said electrically variable capacitance arrangement; means for applying a variable bias voltage to said first and second terminals to bias said semiconductor diodes to a preselected capacitance value establishing a selected center frequency for said output voltage; input means for applying said input voltage to said control terminal to vary the capacitance of said electrically variable capacitance arrangement, whereby the instantaneous frequency of said output voltage varies as a linear function of the magnitude of said input voltage; said input means including variable resistance means for adjusting the sensitivity of the circuit to a desired value; and means coupled to said second secondary winding for obtaining said output voltage.

References Cited

UNITED STATES PATENTS

| | | | |
|---|---|---|---|
| 1,915,368 | 6/1933 | Lack | 331—162 |
| 1,994,658 | 3/1935 | Marrison | 331—162 |
| 3,068,427 | 12/1962 | Weinberg | 332—30 |
| 3,227,967 | 1/1966 | Ebisch | 332—30 |

FOREIGN PATENTS

| | | |
|---|---|---|
| 926,876 | 5/1963 | Great Britain. |

OTHER REFERENCES

Tilton: "A Featherweight Portable Station for 50 Mc.," QST, November, 1964, pp. 24–28.

ROY LAKE, *Primary Examiner.*

J. B. MULLINS, *Assistant Examiner.*